United States Patent
Kim et al.

(10) Patent No.: US 10,865,343 B2
(45) Date of Patent: Dec. 15, 2020

(54) PLASMA ETCHING METHOD

(71) Applicant: AJOU UNIVERSITY INDUSTRY—ACADEMIC COOPERATION FOUNDATION, Suwon-si (KR)

(72) Inventors: Chang-Koo Kim, Seoul (KR); Jun-Hyun Kim, Seongnam-si (KR); Jin-Su Park, Suwon-si (KR)

(73) Assignee: AJOU UNIVERSITY INDUSTRY-ACADEMIC COOPERATION FOUNDATION, Suwon-si (KR)

( * ) Notice: Subject to any disclaimer, the term of this patent is extended or adjusted under 35 U.S.C. 154(b) by 0 days.

(21) Appl. No.: 16/538,134

(22) Filed: Aug. 12, 2019

(65) Prior Publication Data

US 2020/0048550 A1    Feb. 13, 2020

(30) Foreign Application Priority Data

Aug. 13, 2018 (KR) .................. 10-2018-0094281

(51) Int. Cl.
| | |
|---|---|
| *C09K 13/00* | (2006.01) |
| *H01L 21/67* | (2006.01) |
| *H01L 21/311* | (2006.01) |
| *C09G 1/02* | (2006.01) |

(52) U.S. Cl.
CPC ............ *C09K 13/00* (2013.01); *C09G 1/02* (2013.01); *H01L 21/31116* (2013.01); *H01L 21/31144* (2013.01); *H01L 21/67069* (2013.01)

(58) Field of Classification Search
CPC ..... C09G 1/02; C23F 1/00; C23F 1/44; C23F 1/30; C23F 1/40; H01L 21/30625; H01L 21/3212
See application file for complete search history.

(56) References Cited

U.S. PATENT DOCUMENTS

| | | | | |
|---|---|---|---|---|
| 4,484,979 A | * | 11/1984 | Stocker | ............... H01L 21/0337 |
| | | | | 252/79.1 |
| 6,514,425 B1 | * | 2/2003 | Sekiya | ................ H01L 21/3065 |
| | | | | 216/67 |
| 2007/0187362 A1 | * | 8/2007 | Nakagawa | ................ C23F 4/00 |
| | | | | 216/58 |

FOREIGN PATENT DOCUMENTS

| | | |
|---|---|---|
| KR | 10-2017-0076737 A | 7/2017 |
| WO | 2017/159511 A1 | 9/2017 |

\* cited by examiner

*Primary Examiner* — Duy Vu N Deo
(74) *Attorney, Agent, or Firm* — Sughrue Mion, PLLC

(57) ABSTRACT

Provided is a plasma etching method comprising supplying heptafluoropropyl methyl ether (HFE) gas, argon (Ar) gas and oxygen ($O_2$) gas to a plasma chamber receiving an etching target therein, thereby to plasma-etch the etching target.

8 Claims, 9 Drawing Sheets

PLASMA ETCHING METHOD

CROSS-REFERENCE TO RELATED APPLICATION

This application claims a benefit under 35 U.S.C. § 119(a) of Korean Patent Application No. 10-2018-0094281 filed on Aug. 13, 2018, on the Korean Intellectual Property Office, the entire disclosure of which is incorporated herein by reference for all purposes.

BACKGROUND

1. Field

The present disclosure relates to a plasma etching method using an etchant with a low global warming potential.

2. Description of Related Art

There is an increasing demand for a structure having a high aspect ratio due to high density of integrated circuits and miniaturization of devices in semiconductor devices. Generally, the high aspect ratio structure is fabricated in an insulating layer for electrically separating conductive layers from each other. Plasma etching of silicon oxide ($SiO_2$) is widely used to manufacture such a high aspect ratio structure. Currently, perfluorocarbon (PFC) gas such as $CF_4$, $C_2F_6$, $C_3F_6$, $C_3F_8$ and $C_4F_8$ is used in the plasma etching process of the silicon oxide. The PFC gas generates various active species using plasma. In this connection, a carbon fluoride thin film as a carbon-based polymer is deposited on a surface of a substrate using $CF_x$ active species, thereby to protect a mask and serve as a source of etchant to improve selectivity with the mask.

However, the fluorocarbon thin film deposited at the time of plasma etching may inhibit the diffusion of reactive ions and radicals depending on the thickness, thereby inhibiting the etching rate. Further, excessive deposition thereof on a wall of the etched structure causes etch stop, etc. Thus, there is a problem that not only the etching is performed at a desired etching depth but also a diameter of a bottom of the etched structure is smaller than a hole diameter of the mask.

Further, the PFC gas is chemically stable and has a long average residence time in the atmosphere and thus a high global warming potential (GWP) value which is 6500 times or greater higher than GWP of $CO_2$. Thus, the small amount of the PFC gas may greatly contribute to the global warming effect. As a proportion of the etching process in the semiconductor device manufacturing processes increases, an annual amount of PFC gas emissions continues to increase. In order to reduce the emission amount of PFC gas, various methods such as PFC gas decomposition, separation and collection have been employed. However, those methods have fundamental limits due to the PFC gas having the high GWP.

Therefore, there is a need for a novel etchant which may replace the conventional PFC gas, have a low GWP and thus are environmentally friendly, have an excellent etching characteristic to allow a high aspect ratio etched structure to be formed, and a need for a plasma etching method using the novel etchant.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

One purpose of the present disclosure is to provide a novel etchant which may replace the conventional PFC gas, have a low GWP and thus are environmentally friendly, have an excellent etching characteristic to allow a high aspect ratio etched structure to be formed, and is to provide a plasma etching method using the novel etchant.

In one aspect of the present disclosure, there is provided a plasma etching method comprising supplying heptafluoropropyl methyl ether (HFE) gas, argon (Ar) gas, and oxygen ($O_2$) gas to a plasma chamber receiving an etching target therein, thereby to plasma-etch the etching target.

In one implementation, the heptafluoropropyl methyl ether gas and the argon gas are supplied at a flow rate ratio in a range of 1:2 to 1:4.

In one implementation, the heptafluoropropyl methyl ether gas and the argon gas are supplied at a flow rate ratio of 1:2.

In one implementation, the heptafluoropropyl methyl ether gas and the oxygen gas are supplied at a flow rate ratio in a range of 9:1 to 8:2.

In one implementation, the heptafluoropropyl methyl ether gas and the oxygen gas are supplied at a flow rate ratio of 8:2.

In one implementation, the etching target includes silicon oxide.

In one implementation, the etching target includes silicon oxide, wherein a hole pattern mask is disposed on the etching target, wherein the plasma etching allows the etching target to have a high aspect ratio etched structure.

According to the plasma etching method according to the present disclosure, the etching target can be plasma-etched with excellent etching characteristics using the heptafluoropropyl methyl ether (HFE) gas with a very low global warming potential (GWP) of 530 which is much lower than that of the PFC gas. Therefore, in the plasma etching method using the HFE gas, the greenhouse gas emission can be reduced as compared with the semiconductor manufacturing process using the existing PFC gas, and thus, the plasma etching can be performed in an environmentally friendly manner. Further, according to the present invention, when performing the plasma etching using Ar and $O_2$ gas together with the HFE gas, the etching target may be etched to achieve superior etching properties, and in particular, the deposition rate of the fluorocarbon film on the etching target is reduced while increasing the etching rate. Thus, the etching target can be etched while controlling a thickness of the carbon fluoride thin film in an appropriate manner. As a result, when the etching target is subjected to the plasma etching using a hole pattern mask, a high aspect ratio etched structure having little or no difference between a hole dimeter of the hole pattern mask and a diameter of the etched structure.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

DETAILED DESCRIPTIONS

For simplicity and clarity of illustration, elements in the figures are not necessarily drawn to scale. The same reference numbers in different figures denote the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

A plasma etching method according to the present disclosure includes supplying heptafluoropropyl methyl ether (HFE) gas, argon (Ar) gas, and oxygen ($O_2$) gas into a plasma chamber where an etching target is disposed, thereby plasma-etching the etching target.

In this connection, to provide the HFE gas to the plasma chamber, first, a vessel containing the HFE and a chamber connection line connecting the vessel containing the HFE and the plasma chamber may be heated.

Figure 1:
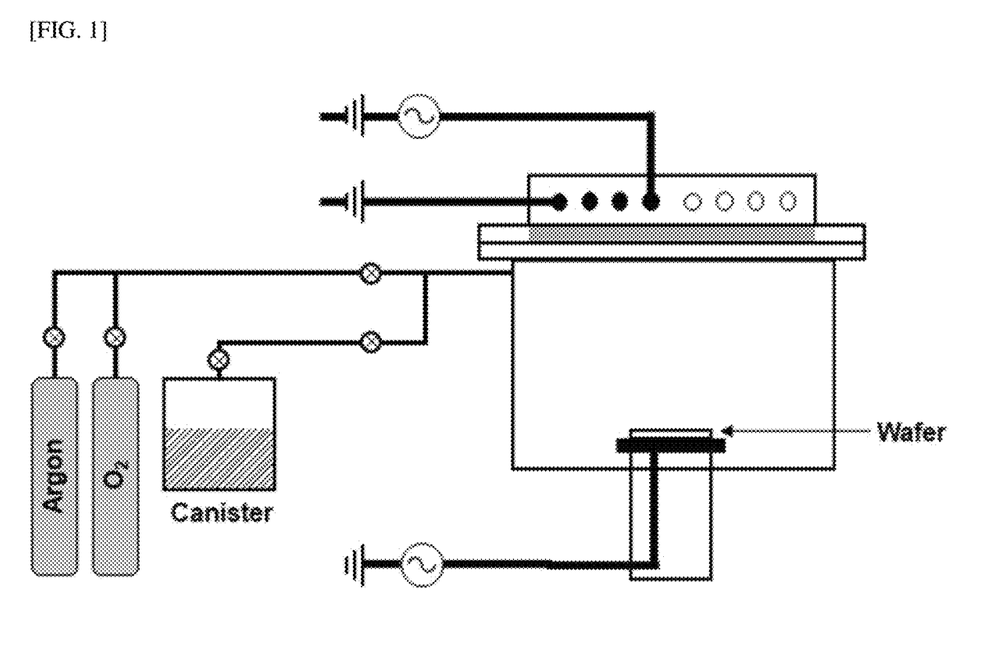
FIG. 1 shows a schematic diagram of a plasma etching apparatus to illustrate a plasma etching method according to one embodiment of the present disclosure.

FIG. 1 shows a schematic diagram of a plasma etching apparatus to illustrate the plasma etching method according to one embodiment of the present disclosure.

As shown in FIG. 1, the HFE has a boiling point of 34° C. Thus, the HFE is present in a liquid phase at room temperature. For this reason, the HFE is vaporized to uniformly introduce the gas-phase HFE into the plasma chamber. The vaporization of HFE according to the present disclosure may be performed by heating the chamber connection line connecting a canister to the plasma etching chamber and heating the canister to accommodate the liquid-phase HFE therein. In this connection, the canister is heated to a temperature above the boiling point of the HFE to vaporize the liquid-phase HFE. It may be desirable to heat the chamber connection line to a higher temperature than the canister heating temperature so that the flow rate does not vary due to the droplet splash in the plasma chamber. In one example, the canister may be heated to 75° C. while the chamber connection line may be heated to 90° C. In this connection, the canister may be heated using a heating jacket. The vaporized HFE, that is, the HFE gas may be injected into the plasma chamber. In this connection, a mass flow controller may be installed just before the plasma chamber to provide a steady flow rate of the vaporized HFE.

According to the present disclosure, the Ar gas and $O_2$ gas are provided into the plasma chamber together with the vaporized HFE gas. In this connection, the Ar gas is injected into the chamber through a separate Ar gas injection line connected to the plasma chamber in a separate manner from the HFE gas. The oxygen gas is injected into the chamber through a separate oxygen gas injection line connected to the plasma chamber in a separate manner from the HFE gas.

According to the present disclosure, the plasma density may be increased in the plasma etching process by injecting the Ar gas together with the HFE gas into the chamber. Thus, ion bombardment may be used to form an anisotropic etched structure. Specifically, when electropositive Ar is added to an electronegative fluorocarbon plasma, the plasma density is increased, such that the decomposition of precursors such as HFE is increased. This has a great influence on the gas phase and surface chemistry. For example, a typical variation of the surface chemistry due to the Ar addition is a decrease in the fluorine content of the steady state fluorocarbon formed on the surface. Further, since Ar is positively charged, the Ar accelerates to a wafer having a negative charge to cause ion bombardments. Accordingly, it is possible to form an anisotropic etched structure in a pattern structure such as a hole pattern.

In one implementation, the heptafluoropropyl methyl ether gas and the argon gas are supplied at a flow rate ratio in a range of 1:2 to 1:9. In one implementation, the heptafluoropropyl methyl ether gas and the argon gas are supplied at a flow rate ratio in a range of 1:2 to 1:4. In one implementation, the heptafluoropropyl methyl ether gas and the argon gas are supplied at a flow rate ratio of 1:2.

In this connection, the $O_2$ gas is injected into the plasma chamber. Thus, this may appropriately control a thickness of the carbon fluoride thin film generated by the plasma etching such that the etch efficiency can be improved. Specifically, in the plasma etching process in accordance with the present disclosure, the $O_2$ gas is used together with the HFE gas to reduce the excessive thickness of the fluorocarbon thin film, such that inhibition of diffusion of reactive ions and radicals may be prevented, and thus the etching target can be etched at an excellent etching rate. Further, since the oxygen gas use may prevent excessive deposition of the fluorocarbon thin film on the wall face of the etched target structure, this may prevent undesired etching stop, thereby to etch the target to a desired depth. Thus, when the etched structure is formed by using the hole pattern mask on the etching target according to the plasma etching method of the present invention, a high aspect ratio etched structure having no difference between the hole diameter of the hole pattern mask and the width of the etched structure may be formed.

However, excessive addition of the $O_2$ gas excessively interferes with the formation of the fluorocarbon film that acts as a source of the etching target such as silicon oxide, such that the etching target may not be etched reliably. Thus, in one implementation, the heptafluoropropyl methyl ether gas and the oxygen gas are supplied at a flow rate ratio in a range of 9:1 to 8:2. In one implementation, the heptafluoropropyl methyl ether gas and the oxygen gas are supplied at a flow rate ratio of 8:2.

The etching target according to the present disclosure may be a material that can be etched according to the etching method according to the present disclosure and may be silicon oxide such as silicon dioxide.

According to the plasma etching method according to the present disclosure, the etching target can be plasma-etched with excellent etching characteristics using the heptafluoropropyl methyl ether (HFE) gas with a very low global warming potential (GWP) of 530 which is much lower than that of the PFC gas. Therefore, in the plasma etching method using the HFE gas, the greenhouse gas emission can be reduced as compared with the semiconductor manufacturing process using the existing PFC gas, and thus, the plasma etching can be performed in an environmentally friendly manner. Further, according to the present invention, when performing the plasma etching using Ar and $O_2$ gas together with the HFE gas, the etching target may be etched to achieve superior etching properties, and in particular, the deposition rate of the fluorocarbon film on the etching target is reduced while increasing the etching rate. Thus, the etching target can be etched while controlling a thickness of the carbon fluoride thin film in an appropriate manner. As a result, when the etching target is subjected to the plasma etching using a hole pattern mask, a high aspect ratio etched structure having little or no difference between a hole dimeter of the hole pattern mask and a width of the etched structure. A more specific example thereof will be described below with reference to an embodiment of the present disclosure.

Hereinafter, a plasma etching method according to the present disclosure will be described with reference to a more specific embodiment.

To perform the plasma-etch according to one embodiment of the present disclosure, first, a canister containing a liquid-phase heptafluoropropyl methyl ether (HFE-347mcc3) is heated to 75° C. to prepare an HFE gas. Then, the chamber connection line connecting the canister and the plasma chamber to each other is heated to 90° C.

Figure 2:
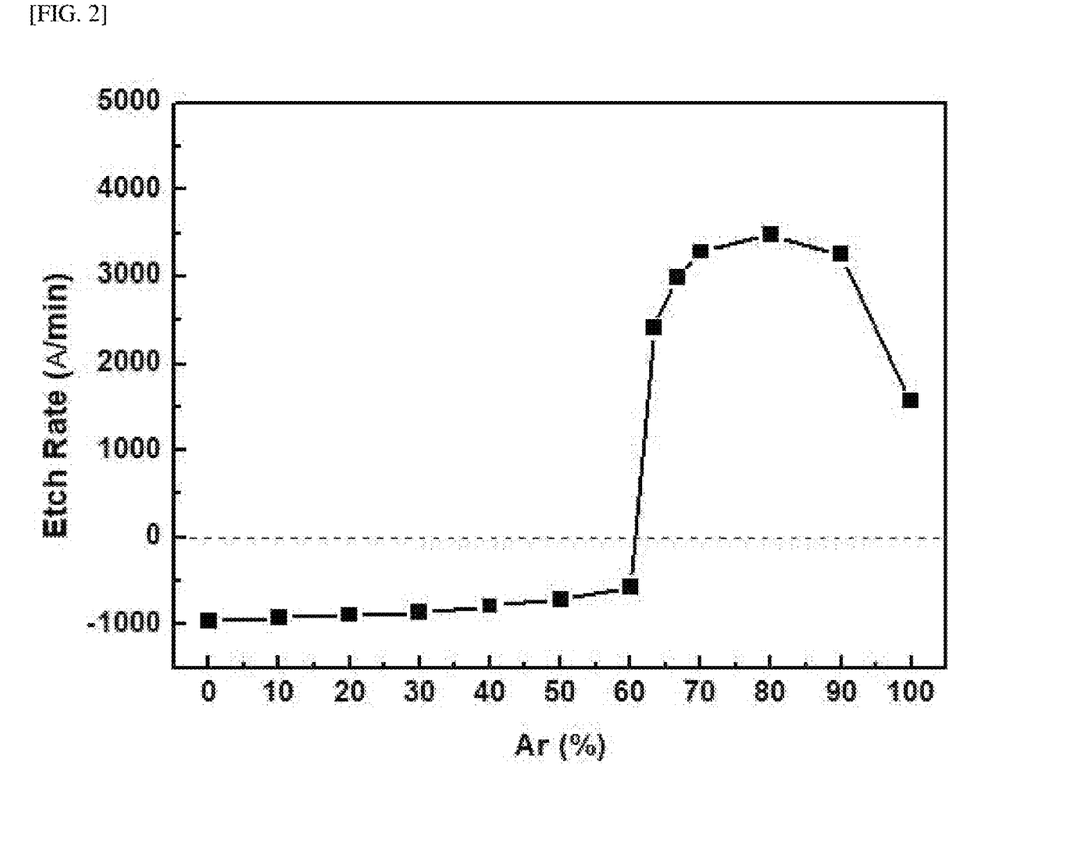
FIG. 2 shows an etching rate variation of a $SiO_2$ thin film based on a ratio between a HFE flow rate and an Ar flow rate.

Prior to performing the HFE/$O_2$/Ar plasma etching, plasma etching was performed using only HFE and Ar to check a etch rate based on a ratio between the HFE and Ar flow rates. Specifically, each of HFE and Ar gases is supplied to the plasma chamber while changing a ratio between the flow rates of the HFE gas and the Ar gas. Then, a 500 nm thick $SiO_2$ thin film on the silicon was subjected to plasma etching (the process was controlled so that the total flow rates of HFE and Ar was 30 sccm). The specific plasma etching process conditions are shown in Table 1, and the etching rate according to the Ar flow rate is shown in FIG. 2.

TABLE 1

| Source power (W) | Bias voltage (V) | Discharge Gas | Total Flow Rate (sccm) | Pressure (mTorr) | Substrate Temperature (° C.) |
|---|---|---|---|---|---|
| 250 | −600 | HFE/Ar | 30 | 10 | 15 |

The total flow rate, pressure, and substrate temperature as set forth above are merely examples. Thus, the present disclosure is not necessarily limited thereto. The total flow rate, pressure, and substrate temperature presented in the present disclosure may vary from one plasma etch equipment to another).

FIG. 2 is a diagram for illustrating an etching rate variation of a $SiO_2$ thin film according to a ratio between an Ar flow rate and HFE flow rate.

As shown in FIG. 2, when the flow rate percentage of Ar is in a range of 0 to 60%, the $SiO_2$ thin film is deposited without being etched. The $SiO_2$ thin film is etched when the Ar flow rate percentage reaches 63% (HFE-347mcc3 11 sccm, Ar 19 sccm) or greater. In particular, it may be seen that the etching rate is the largest when the Ar flow rate percentage is 80%.

That is, according to the present disclosure, it may be confirmed that the etching target can be etched at an excellent etching rate by supplying the HFE gas and Ar gas to the plasma chamber at a flow rate ratio in a range of 1:2 to 1:9. Further, it may be confirmed that the etching target can preferably be etched at an excellent etching rate by supplying the HFE gas and Ar gas to the plasma chamber at a flow rate ratio in a range of 1:2 to 1:4. In particular, it may be confirmed that etching target can be etched with excellent etching characteristics by injecting the HFE gas and Ar gas at a flow rate ratio of 1:2.

However, as the flow rate percentage of Ar increases, the plasma density continues to increase, thus making it difficult to generate a high bias voltage. For this reason, when a plasma etched high aspect ratio structure is to be formed according to the present disclosure, it may be desirable that the Ar flow rate percentage is smaller than 70% to generate a high bias voltage. Thus, in order to achieve a stable −1200 V bias voltage, we set the Ar flow rate percentage to 67% (Ar 20 sccm, total flow rate 30 sccm).

Next, in order to identify the etch characteristics according to the ratio between HFE and $O_2$ flow rates, the Ar flow rate percentage was set to be 67% (20 sccm) of the total flow rate. Then, we checked the etching rates of an amorphous carbon layer (ACL) and the $SiO_2$ thin film by HFE/$O_2$/Ar plasma etching according to the present disclosure while changing the ratio of HFE and $O_2$ flow rates. The specific etching process conditions are shown in Table 2 below, and the etching rate is shown in FIG. 3.

TABLE 2

| Source power (W) | Bias voltage (V) | Discharge Gas (X/Y) | Total Flow Rate (sccm) | Pressure (mTorr) | Substrate Temperature (° C.) |
|---|---|---|---|---|---|
| 200 | −1200 | HFE-347mcc3/ $O_2$/Ar | 1. X/Y/Z: 10/0/20<br>2. X/Y/Z: 9/1/20<br>3. X/Y/Z: 8/2/20 | 10 | 15 |

Figure 3:
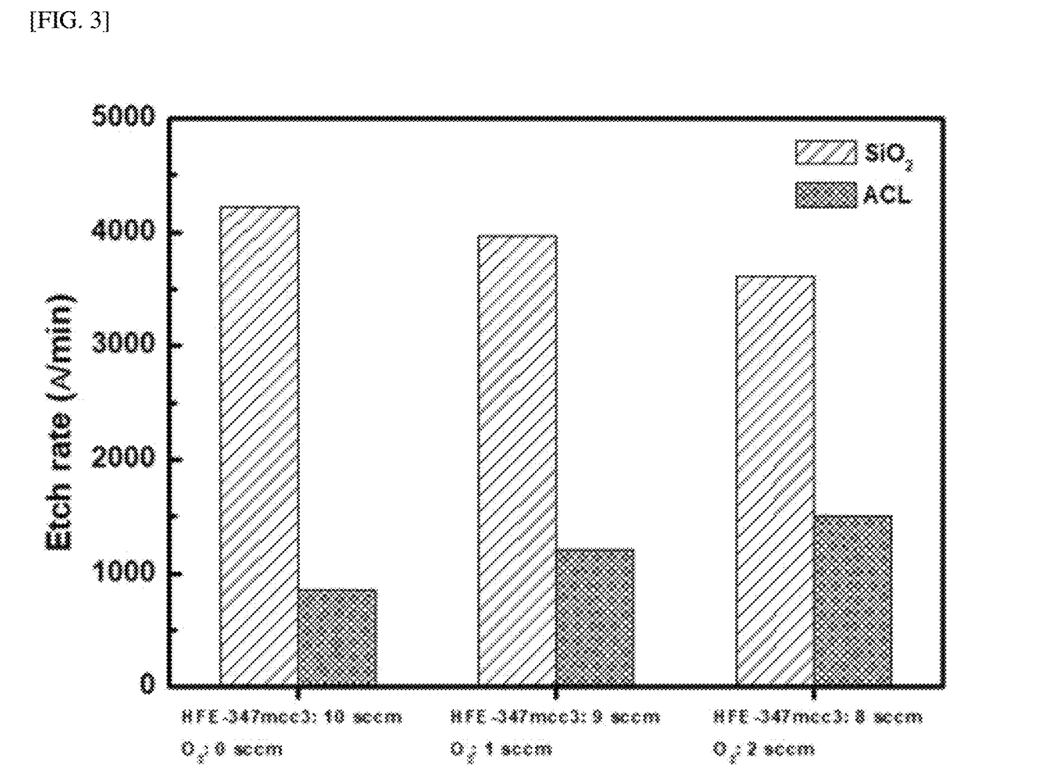
FIG. 3 shows an etching rate variation of a $SiO_2$ thin film based on a ratio between a HFE flow rate and an oxygen flow rate.

FIG. 3 shows an etching rate variation of a $SiO_2$ thin film based on a ratio between a HFE flow rate and an oxygen flow rate.

Referring to FIG. 3, as $O_2$ is added and thus the flow rate percentage of HFE is reduced, the etching rate of $SiO_2$ is decreased from 4230 Å/min to 3616 Å/min. On the other hand, it may be seen that the etching rate increases from 848 Å/min to 1500 Å/min as the $O_2$ flow rate percentage increases. This is because as the flow rate percentage of $O_2$ increases and the flow rate percentage of HFE decreases, the amount of etchant that can etch $SiO_2$ decreases and the etching rate thereof decreases, whereas an increase in the etching rate of ALC occurs due to the chemical reaction $O_2+C \rightarrow CO_2$ occurring due to the increase in the $O_2$ flow rate. Further, as $O_2$ is added and thus the flow rate of HFE-347 is reduced, the etch selectivity of $SiO_2$ and ACL decreases from 5.0 to 2.4.

Further, Further, we set the Ar flow rate percentage to be 67% (20 sccm) of the total flow rate and then varies a ratio between HFE and $O_2$ flow rates to identify the deposition rate of the fluorocarbon thin film and the etch rate of the fluorocarbon thin film using the HFE/$O_2$/Ar plasma gas according to the present disclosure. The conditions for the deposition of the carbon fluoride thin film are as shown in Table 3, and the conditions for the etching of the deposited fluorocarbon thin film are as shown in Table 2 above. The respective results are shown in FIGS. 4A and 4B.

TABLE 3

| Source power (W) | Bias voltage (V) | Discharge Gas (X/Y) | Total Flow Rate (sccm) | Pressure (mTorr) | Substrate Temperature (° C.) |
|---|---|---|---|---|---|
| 250 | 0 | HFE-347mcc3/ $O_2$/Ar | 1. X/Y/Z: 10/0/20<br>2. X/Y/Z: 9/1/20<br>3. X/Y/Z: 8/2/20 | 10 | 15 |

Figure 4A:
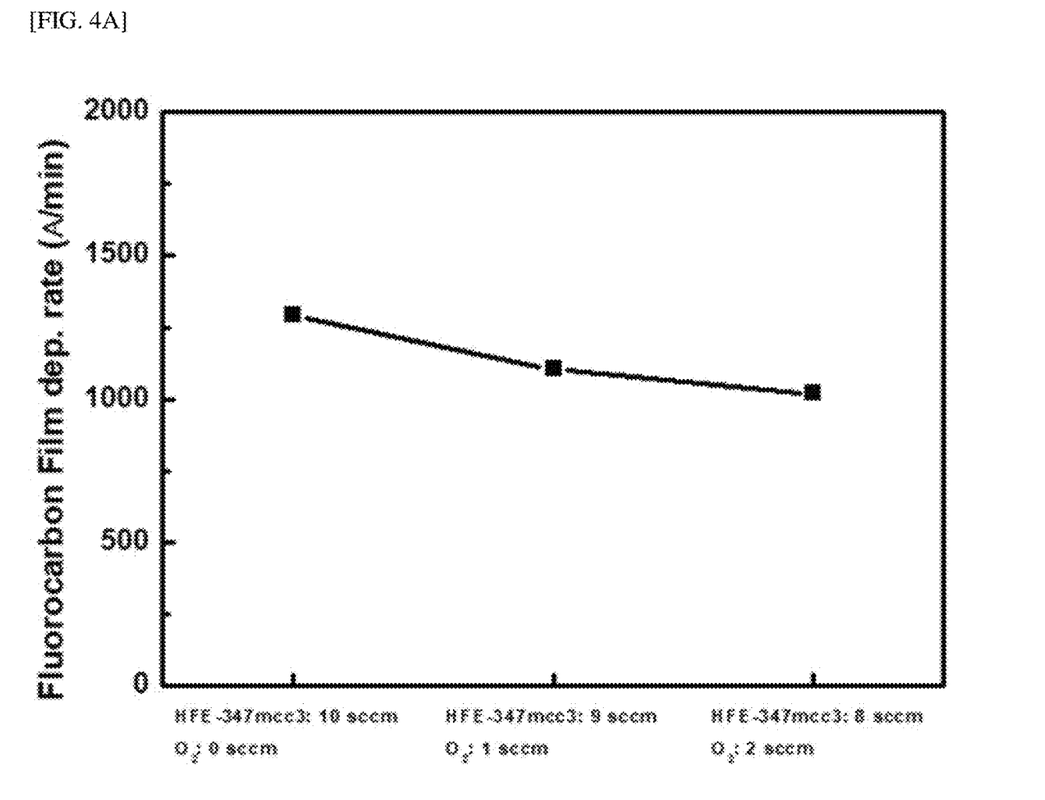
FIGS. 4A and 4B are views describing deposition and etching rates of the fluorocarbon thin film on a ratio between a HFE flow rate and an oxygen flow rate.
Figure 4B:
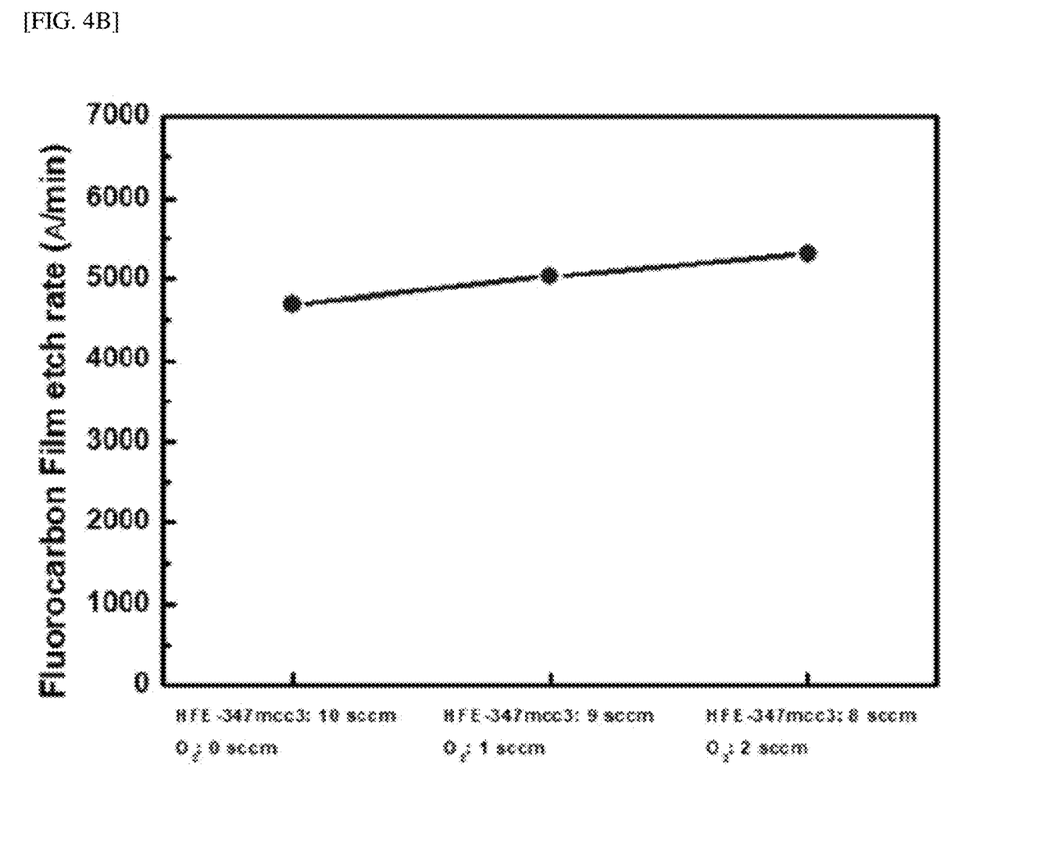

FIGS. 4A and 4B are views describing deposition and etching rates of the fluorocarbon thin film on a ratio between a HFE flow rate and an oxygen flow rate.

Referring to FIGS. 4A and 4B, as shown in FIG. 4A, as the flow rate of HFE decreases and the flow rate of $O_2$ increases, the deposition rate of the carbon fluoride thin film is gradually decreased. To the contrary, as shown in FIG. 4B, as the flow rate of HFE decreases and the flow rate of $O_2$ increases, the fluorocarbon thin film is etched using the chemical reaction $O_2+C \rightarrow CO_2$ due to the $O_2$ radicals, and thus the etching rate is gradually increased.

Etching using a material composed of carbon (C) and fluorine (F) forms a thin film of fluorocarbon on a surface of the substrate. The smaller a F/C ratio is, the more the formation amount of the fluorocarbon thin film becomes. The F/C ratio of HFE is 1.75, which is between $C_4F_8$ (F/C: 2) and $C_4F_6$ (F/C: 1.5), which are most used for implementation of a high aspect ratio $SiO_2$ etched structure. In this connection, in the HFE/$O_2$/Ar plasma etching according to the present disclosure, as shown in FIGS. 4A and 4B, increasing the $O_2$ flow rate may lead to decreasing the deposition rate of the fluorocarbon thin film and increasing the etching rate thereof. This may reduce the thickness of the fluorocarbon thin film formed on the surface during etching the $SiO_2$ layer into a high aspect ratio structure. Thus, the etch stop, sidewall necking, and the like can be prevented.

Figure 5:
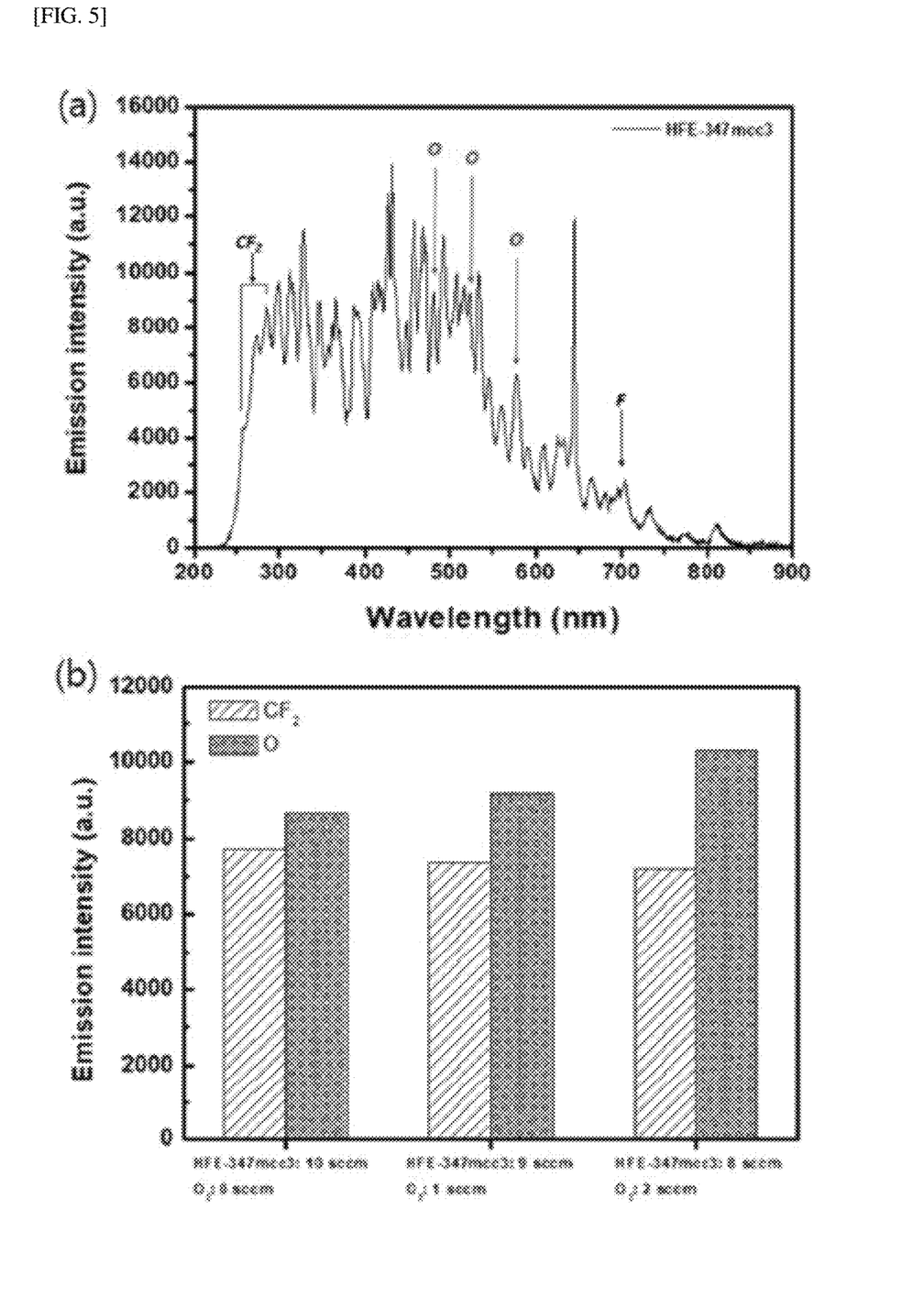
FIG. 5 is a diagram for illustrating an optical emission spectroscopy result.

To identify this effect in more detail, while the ratio between the flow rate of HFE and $O_2$ varied, an optical emission spectroscopy (OES) was performed, the results are shown in FIG. 5.

FIG. 5 is a diagram for describing the result of optical emission analysis.

(a) of FIG. 5 shows the results of optical emission analysis of HFE (HFE-347 mcc3) plasma. (b) of FIG. 5 shows changes in the amounts of $CF_2$ radicals and O radicals as produced by the HFE/$O_2$/Ar plasma of the present disclosure, based on the ratio between the flow rate of HFE and $O_2$.

Referring to (a) of FIG. 5, it may be confirmed from the results of the optical emission analysis of the HFE plasma that $CF_2$ radicals and F radicals are generated. Further, HFE-347mcc3 contains oxygen atoms inherently, and thus, molecules thereof are decomposed by plasma formation to generate O radicals.

In comparison, referring to (b) of FIG. 5, according to the plasma etching of the present disclosure, as the flow rate of HFE decreases and the flow rate of $O_2$ increases, the amount of $CF_2$ radicals decreases and the amount of O radicals increases. The CF2 radical and the O radical are the key radicals in forming a fluorocarbon film. As the flow rate of $O_2$ increases, the amount of $CF_2$ radicals decreases and the amount of O radicals increases. This may correspond to the result that the deposition rate of the carbon fluoride thin film is decreased and the etching rate of the fluorocarbon thin film is increased as described with reference to FIGS. 4A and 4B.

That is, performing the plasma etching process including providing HFE, Ar, and $O_2$ according to the plasma etching process of the present disclosure may result in etching the fluorocarbon thin film while forming the fluorocarbon thin film to be an etching source of $SiO_2$, thereby to allow the thickness of the carbon fluoride thin film to be appropriately controlled. As a result, it is possible to prevent problems such as etching stop and side wall necking as caused by the excessive fluorocarbon thin film, such that the etching target can be etched with an excellent etching efficiency.

In order to fabricate a high aspect ratio etched structure by plasma etching in accordance with the present disclosure, a hole pattern mask was first formed on a specimen ($SiO_2$ thin film). The hole pattern mask has a total thickness of 1400 nm and has a structure composed of a 1350 nm ACL and a 50 nm SiON thin film thereon. The mask was formed on the 2400 nm thick $SiO_2$ thin film. A diameter of the hole of the formed hole pattern mask was 200 nm. Then, the specimen ($SiO_2$ thin film) on which the hole pattern mask was formed was subjected to plasma etching under the conditions shown in Table 4, and the results are shown in FIGS. 6 to 8.

TABLE 4

| Source power (W) | Bias voltage (V) | Discharge Gas (X/Y) | Total Flow Rate (sccm) | Pressure (mTorr) | Substrate Temperature (° C.) | Etching time duration (min) |
|---|---|---|---|---|---|---|
| 250 | −1200 | HFE-347mcc3/ O$_2$/Ar | 1. X/Y/Z: 10/0/20<br>2. X/Y/Z: 9/1/20<br>3. X/Y/Z: 8/2/20 | 10 | 15 | 12 |

Figure 6:
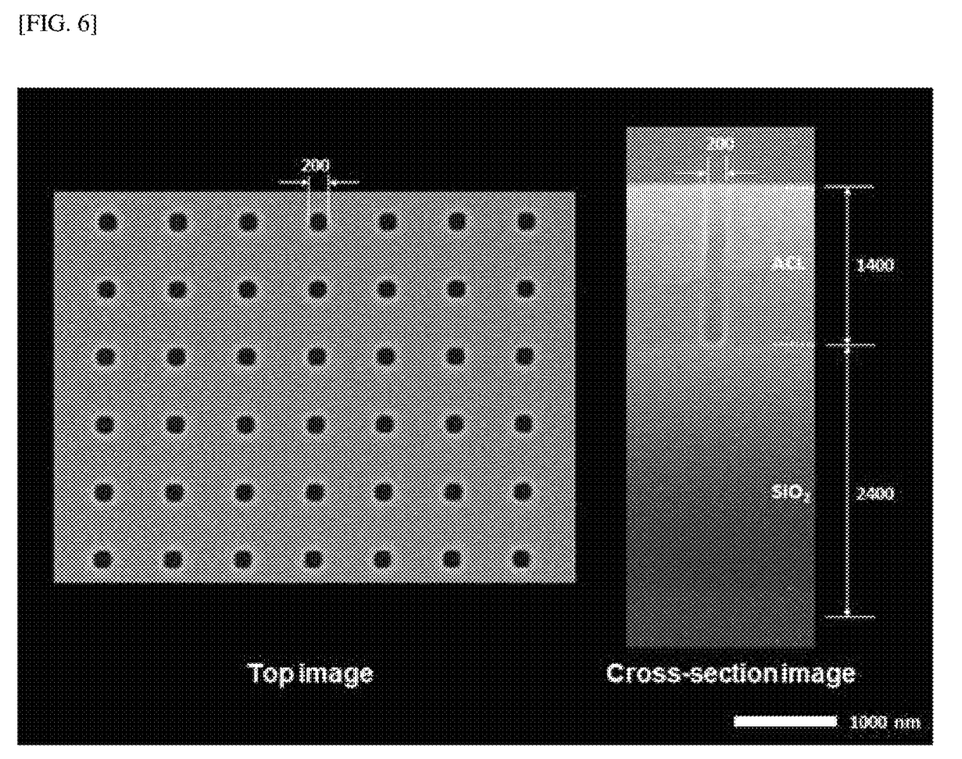
FIG. 6 to FIG. 8 illustrate formation of a high aspect ratio etched structure according to the present disclosure.
Figure 7:
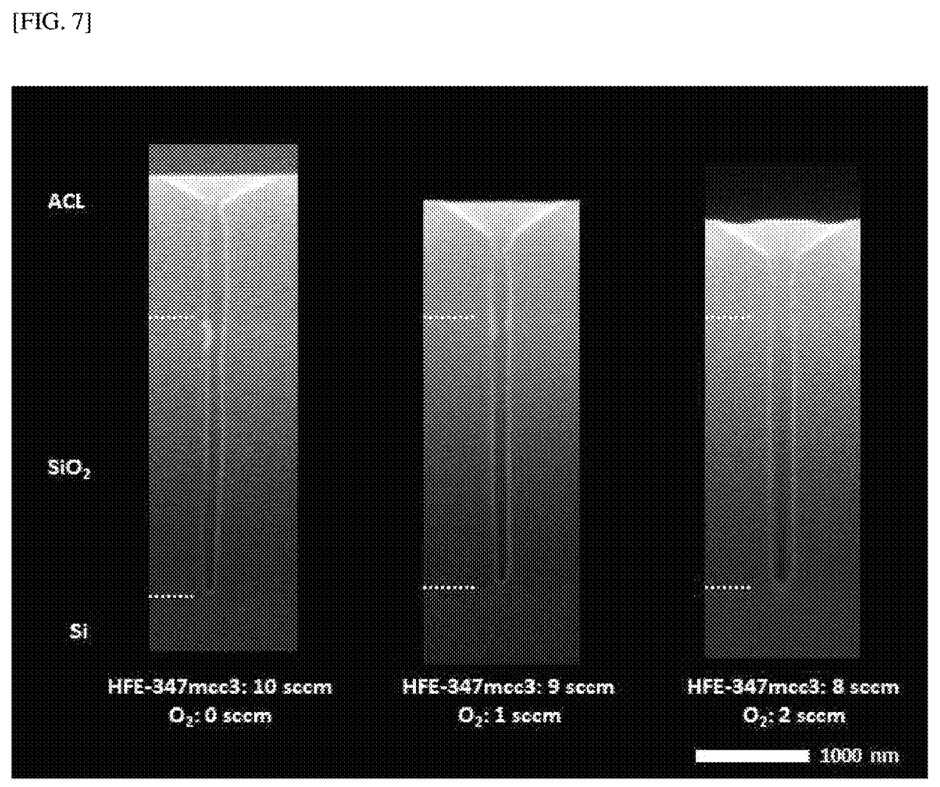
Figure 8:
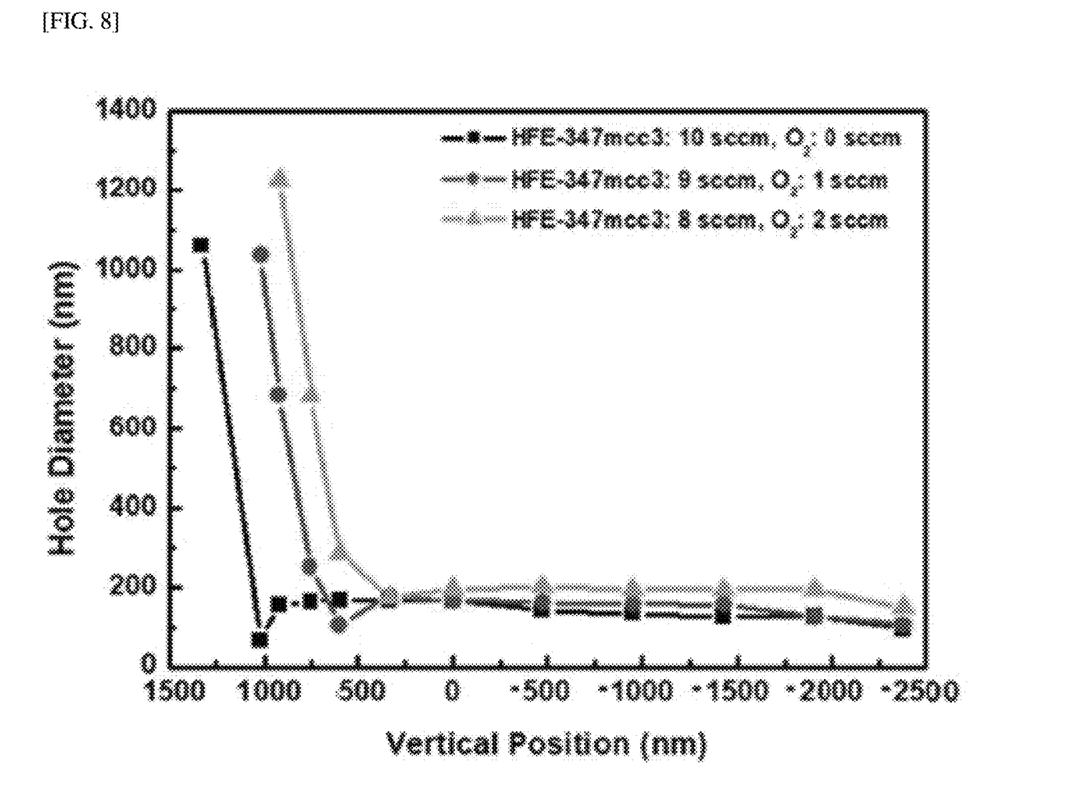

FIG. 6 to FIG. 8 illustrate formation of a high aspect ratio etched structure according to the present disclosure.

FIG. 6 is a scanning electron microscope (SEM) cross-sectional photograph of a specimen on which a hole pattern mask is formed before etching. FIG. 7 shows a SEM cross-sectional photograph after a specimen with a 200 nm hole pattern mask thereon is etched for 12 minutes according to the flow rate ratio conditions in Table 4. FIG. 8 is a graph showing a change in a hole diameter defined in the specimen along a vertical length of the specimen including a vertical length of the hole pattern mask remaining after the etching. In this connection, a boundary between the ACL mask and the SiO$_2$ layer is set to a vertical level zero.

Referring to FIG. 6 to FIG. 8, first, as shown in FIG. 7, all the specimens are etched to the bottom depth of 2400 nm after 12 minutes of etching according to the present disclosure. However, it was seen that the necking occurred at a 1020 nm vertical level of the ACL mask in the specimen of HFE 10 sccm and O$_2$ 0 sccm. As the necking is formed in the top portion of the ACL mask, the etched hole diameter is not uniform as shown in FIG. 8. The etched hole diameter was 130 nm which is smaller than 200 nm, which is the initial hole diameter of the mask. In this case, the etch stop may occur when the hole diameter of the ACL mask is reduced or the depth of the SiO$_2$ to be etched becomes larger. On the other hand, in the specimen of HFE 9 sccm and O$_2$ 1 sccm, the necking occurred at the vertical level 598 nm of the ACL mask. In this case, the specimen has a relatively uniform and larger etched hole diameter compared to the specimen of HFE 10 sccm and O$_2$ 0 sccm. On the contrary, in the specimen of HFE 8 sccm and O$_2$ 2 sccm, the necking occurred at the vertical position 335 nm of the ACL mask. In this case, the etched hole diameter was in a range of 195 to 202 nm, which was very close to the initial hole diameter 200 nm of the mask.

That is, it may be confirmed that the plasma etching process according to the present disclosure using the combination of HFE, O$_2$, and Ar gases may form a uniform, high aspect ratio etched structure having a diameter similar to a hole diameter of the mask pattern. Especially, it may be confirmed that when the ratio of the flow rates of HFE and O$_2$ is 8:2, a uniform high aspect ratio etched structure having a diameter substantially similar to the hole dimeter of the mask pattern is formed. Thus, even when a hole pattern with a smaller hole diameter is used, a high aspect ratio etched structure having a diameter substantially similar to the hole dimeter of the mask pattern can be formed using the plasma etching process according to the present disclosure.

According to the plasma etching method according to the present disclosure, the etching target, that is, the silicon oxide can be plasma-etched with excellent etching characteristics using a combination of heptafluoropropyl methyl ether (HFE) with a very low global warming potential (GWP) and argon and oxygen gases. According to the present disclosure, the plasma etching method can exhibit an etching characteristic more excellent than that of a plasma etching method using the conventional PFC gas having a high GWP at the same condition and thus can etch the etching target in an environmentally friendly manner. Thus, the present plasma etching method using the combination of heptafluoropropyl methyl ether (HFE) and argon and oxygen gases may replace the plasma etching method using the conventional PFC gas.

Further, using the etching method according to the present disclosure may provide for a high aspect ratio etched structure made of the silicon oxide. Accordingly, the plasma etching method according to the present disclosure may be applied to a plasma etching process in various technical fields such as a semiconductor, a display, MEMS, etc. using the conventional PFC gas such that environmentally friendly etching may be performed with excellent characteristics.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. A plasma etching method comprising supplying heptafluoropropyl methyl ether (HFE) gas, argon (Ar) gas, and oxygen (O$_2$) gas to a plasma chamber receiving an etching target therein, thereby to plasma-etch the etching target,
   wherein the plasma chamber is connected to a canister containing heptafluoropropyl methyl ether (HFE) in a liquid phase by a chamber connecting line, and
   wherein the supplying comprises:
   generating the HFE gas by heating the canister at a first temperature higher than a boiling point of the HFE and heating the chamber connecting line at a second temperature higher than the first temperature, and
   supplying the generated HFE gas to the plasma chamber through the chamber connecting line.

2. The plasma etching method of claim 1, wherein the heptafluoropropyl methyl ether gas and the argon gas are supplied to the plasma chamber at a flow rate ratio in a range of 1:2 to 1:4.

3. The plasma etching method of claim 2, wherein the heptafluoropropyl methyl ether gas and the argon gas are supplied to the plasma chamber at a flow rate ratio of 1:2.

4. The plasma etching method of claim 1, wherein the heptafluoropropyl methyl ether gas and the oxygen gas are supplied to the plasma chamber at a flow rate ratio in a range of 9:1 to 8:2.

5. The plasma etching method of claim 4, wherein heptafluoropropyl methyl ether gas and the oxygen gas are supplied to the plasma chamber at a flow rate ratio of 8:2.

6. The plasma etching method of claim 1, wherein the etching target includes silicon oxide.

7. The plasma etching method of claim 1, wherein the etching target includes silicon oxide, wherein a hole pattern mask is disposed on the etching target, wherein the plasma etching allows the etching target to have a high aspect ratio etched structure.

8. The plasma etching method of claim 1, wherein the argon gas is supplied to the plasma chamber through an argon gas injection line different from the chamber connecting line, and the oxygen gas is supplied to the plasma chamber through an oxygen gas injection line different from the chamber connecting line.

\* \* \* \* \*